(12) United States Patent
Peschke

(10) Patent No.: US 11,035,881 B2
(45) Date of Patent: Jun. 15, 2021

(54) PROBE, MEASURING SYSTEM AS WELL AS TEST SETUP

(71) Applicant: Rohde & Schwarz GmbH & Co. KG, Munich (DE)

(72) Inventor: Martin Peschke, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 618 days.

(21) Appl. No.: 15/494,338

(22) Filed: Apr. 21, 2017

(65) Prior Publication Data

US 2018/0306838 A1 Oct. 25, 2018

(51) Int. Cl.
*G01R 1/04* (2006.01)

(52) U.S. Cl.
CPC .................................. *G01R 1/0416* (2013.01)

(58) Field of Classification Search
CPC .................................................... G01R 1/0416
See application file for complete search history.

(56) References Cited

U.S. PATENT DOCUMENTS

| 5,172,051 | A | * | 12/1992 | Zamborelli | ........ | G01R 1/06772 324/149 |
| 6,049,219 | A | * | 4/2000 | Hwang | .............. | G01R 1/06772 324/750.3 |
| 7,015,709 | B2 | * | 3/2006 | Capps | ................. | G01R 1/06772 324/149 |
| 2004/0164754 | A1 | * | 8/2004 | Holcombe | ......... | G01R 1/07314 324/754.14 |
| 2011/0074390 | A1 | * | 3/2011 | Bartlett | .............. | G01R 1/06766 324/76.41 |

* cited by examiner

*Primary Examiner* — Paresh Patel
(74) *Attorney, Agent, or Firm* — Christensen O'Connor Johnson Kindness PLLC

(57) ABSTRACT

A probe for measurements on a device under test with low source impedance is described. The probe has a resistor coupled in series between a probe tip and a probe cable connected to a measuring apparatus. The resistor having an impedance equal to a characteristic impedance of the probe cable or equal to the difference between the characteristic impedance of the probe cable and an output resistance of the device under test. Further, a measuring system and a test setup are described.

10 Claims, 1 Drawing Sheet

PROBE, MEASURING SYSTEM AS WELL AS TEST SETUP

FIELD OF THE DISCLOSURE

Embodiments of the present disclosure relate generally to a probe for measurements on a device under test, a measuring system comprising a measuring apparatus with high-impedance input and a passive probe, as well as a test setup for measurements on a device under test with low source impedance.

BACKGROUND

In the field of electrical measurements, many situations call for measurements of a high-bandwidth signal, i.e. signals with a bandwidth of more than 50 MHz, with a high sensitivity, e.g. lower than 10 mV/div. Problems arise, when a measuring apparatus, for example an oscilloscope, with high input impedance, usually 1 MΩ, is used. In this case, known general purpose 1:1 probes are not feasible because their bandwidth is limited to about 40 MHz. On the other hand, 10:1 probes have a higher bandwidth but their sensitivity is limited to more than 10 mV/div because of their divider ratio.

SUMMARY

Thus, there is a need for a probe allowing high bandwidth measurements with very high sensitivity on high impedance measuring apparatuses.

To address this need, among others, embodiments of the present disclosure provide a probe for measurements on a device under test with low source impedance, comprising:
a probe tip for connecting the probe to the device under test;
a probe cable coupled to the probe tip;
an output connector for connecting the probe cable to a measuring apparatus; and
a resistor coupled in series between the probe tip and the probe cable.

The probe being a passive probe, the probe cable having a characteristic impedance, the resistor having an impedance equal to one of the characteristic impedance of the probe cable and a difference between the characteristic impedance of the probe cable and an output resistance of the device under test.

Embodiments of the present disclosure further provide a measuring system comprising a measuring apparatus with a high-impedance input and a passive probe as mentioned above, the output connector of the passive probe being connected to the high-impedance input.

Furthermore, embodiments of the present disclosure provide a test setup for measurements on a device under test with low source impedance comprising the device under test, a measuring apparatus and a passive probe, comprising a probe tip for connecting the probe to the device under test; a probe cable coupled with the probe tip; and an output connector connected to the measuring apparatus. The probe cable having a characteristic impedance, a resistor being provided, the resistor being coupled in series between the device under test and the probe cable, the resistor having an impedance equal to one of the characteristic impedance of the probe cable and a difference between the characteristic impedance of the probe cable and an output resistance of the device under test.

By fixing or adjusting the impedance of the probe cable to match the device under test, it is possible to use the probe for high-bandwidth measurements with low attenuation and thus a high sensitivity at a high-impedance input of a measuring apparatus.

The probe, the apparatus and the test setup are perfectly suited for measurements on power rails, at power supplies, on transistor outputs, and across current sense resistors, such as shunts, etc.

The characteristic impedance of the probe cable may be one of 50Ω, 75Ω, 100Ω, and 150Ω in order to closely match the impedance of the probe cable to the device under test.

For increasing measurement quality, the resistor is located adjacent to the probe tip. For example, no further components are located between the probe tip and the resistor. Thus, the inductance is minimized. The inductance has an influence on measurements with higher frequency.

According to an embodiment, the probe cable comprises an inner conductor, the resistor being connected to the inner conductor to further improve the measurement quality. The resistor may be soldered or crimped to the inner conductor, for instance high temperature soldered. Furthermore, other techniques are also suitable in order to connect the resistor to the inner conductor.

For example, the passive probe cable is a coaxial cable allowing the use of standard components to reduce costs.

In another aspect, the probe tip is adapted to be connected to the device under test via one of a socket and a rigid solder joint. This way, a durable and reliable connection to the device under test is provided.

In an embodiment, the passive probe comprises a housing, the housing comprising the resistor, the housing being connected to the probe cable via one of a detachable connector and a rigid solder joint. By using a detachable connector, the resistor can easily be changed in order to adapt the resistance and impedance of the probe to the device under test. Furthermore, the resistor is accommodated safely in the housing.

In another embodiment, the probe comprises an inductive component being located between the probe cable and the output connector. The inductive component may be a coil. This way, the quality of measurement can be improved further. Particularly, the frequency response of the probe can be adjusted by the inductive component.

For example, the measuring apparatus may be an oscilloscope to provide a versatile and modular measuring system.

To achieve a high quality measurement, the measuring apparatus comprises a high-impedance input and the output connector being connected to the high-impedance input.

In an embodiment, the resistor is accommodated in a housing being separately formed with respect to the probe, the probe cable being connected to the housing via one of a detachable connector and a rigid solder joint to allow a simple change of resistors. Moreover, the resistor is safely accommodated.

The measuring system may comprise a probe as described above.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawing, wherein

DETAILED DESCRIPTION

The detailed description set forth below in connection with the appended drawing, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

In the following description, numerous specific details are set forth in order to provide a thorough understanding of one or more embodiments of the present disclosure. It will be apparent to one skilled in the art, however, that many embodiments of the present disclosure may be practiced without some or all of the specific details. In some instances, well-known process steps have not been described in detail in order not to unnecessarily obscure various aspects of the present disclosure. Further, it will be appreciated that embodiments of the present disclosure may employ any combination of features described herein.

Figure 1:
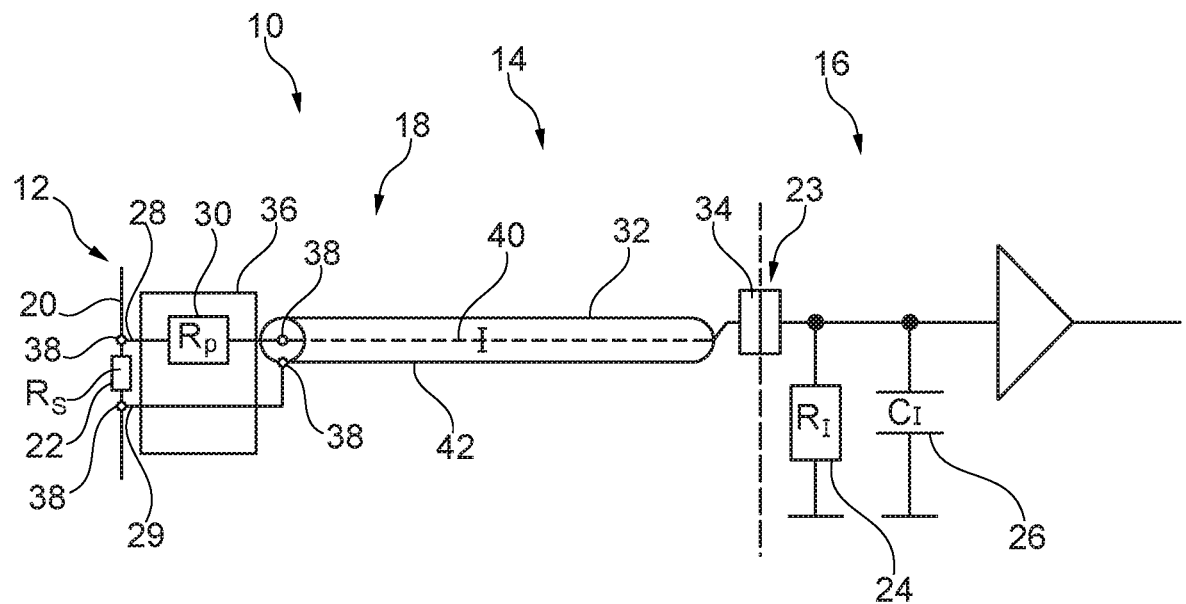
FIG. 1 shows a schematic overview of a first embodiment of a test setup according to an aspect of the disclosure comprising a measurement system according to an aspect of the disclosure having a probe according to an aspect of the disclosure.

FIG. 1 shows a test setup 10 schematically, comprising a device under test 12 and a measuring system 14. The measuring system 14 has a measuring apparatus 16, for example an oscilloscope, and a probe 18, for example a passive probe.

The device under test 12 has a low source impedance. In the shown embodiment, the device under test 12 is illustrated as a signal line 20 with a test resistor 22 having a source impedance or resistance $R_S$, for example 1Ω.

The test resistor 22 may be a shunt or current sense resistor. It is also possible that measurements are performed on the device under test 12 on power rails, at power supplies or on transistor outputs, for example.

The measuring apparatus 16, on the other hand, has a high-impedance input 23 for measurements. The high input impedance is illustrated by input resistor 24 having a resistance $R_I$ of, for example, 1 MΩ and an input capacitor having a capacitance $C_I$ of, for example, 10 pF.

For measurements, the device under test 12 is connected to the measuring apparatus 16 using the probe 18.

The probe 18 comprises a first probe tip 28, a second probe tip 29, a resistor 30, a probe cable 32, an output connector 34, and a housing 36. The first probe tip 28 is connected to the signal line 20 of the device under test 12 at one end of the test resistor 22. The second probe tip 29 is connected to the signal line 20 at the other end of the test resistor 22. These connections may be rigid solder joints 38. It is also possible, that the connections are sockets.

Adjacent to the first probe tip 28, the resistor 30 is located meaning that no other components are provided between the first probe tip 28 and the resistor 30. In the exemplary embodiment of FIG. 1, the resistor 30 is received in the housing 36.

The housing 36, or more precisely the resistor 30, is connected to the probe cable 32. The probe cable has a characteristic impedance I of, for example, 50Ω. The probe cable 32 may be a coaxial cable having an inner conductor 40 and an outer conductor 42.

The resistor 30 is electrically connected to the inner conductor 40 providing an electrical connection between the first probe tip 28 and the inner conductor 40. The second probe tip 29 is electrically connected to the outer conductor 42.

At the end of the probe cable 32 not connected to the resistor 30, the output connector 34 of the probe 18 is located. The output connector 34 is connected to the high-impedance input 23 of the measuring apparatus 16 in order to connect the probe cable 32 to the measuring apparatus 16.

The second probe tip 29 may also be connected to the measuring apparatus 16, for example ground or a second input of the measuring apparatus 16.

In some embodiments, the high-impedance input 23 is a coaxial one such that both probe tips 28, 29 are connected with a single input of the measuring apparatus 16.

In order to perform a high-bandwidth measurement (bandwidth of more than 50 MHz), the impedance, i.e. the resistance $R_P$ of the resistor 30 of the probe 18 may be chosen to match the characteristic impedance I of the probe cable 32. For example, the resistance $R_P$ may be 50Ω, 75Ω, 100Ω or 150Ω.

In the described example, however, the resistor 30 has an impedance or resistance $R_P$ being the difference between the characteristic impedance I of the probe cable 32 and the source impedance, i.e. output resistance of the device under test 12, in this case the resistance $R_S$ of the test resistor 22. Therefore, for the above mentioned values (I=50Ω, $R_S$=1Ω), the impedance or resistance $R_P$ of the resistor 30 is 49Ω.

Thus, the resistor 30 adapts the impedance of the device under test 12 to the impedance of the probe cable 32 and absorbs reflected signals coming from the other end of the probe cable 32. Accordingly, high quality measurements are possible over a broad bandwidth with an attenuation of 1:1 using the probe 18. Thus, a 1:1 passive probe is provided.

Figure 2:
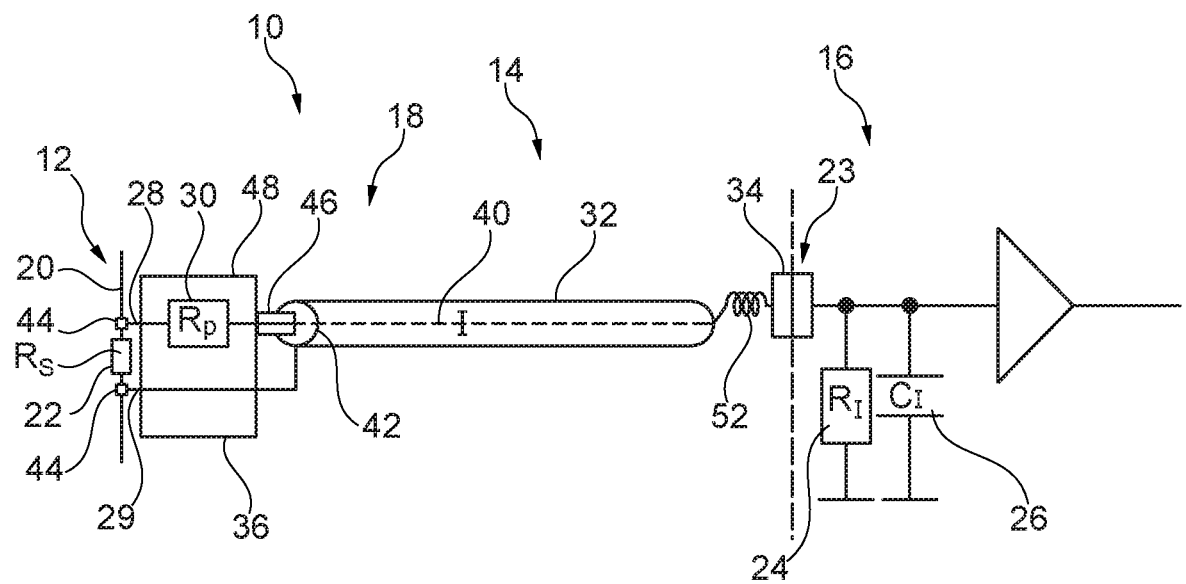
FIG. 2 shows a second embodiment of a test setup according to an aspect of the disclosure comprising a measurement system according to an aspect of the disclosure having a probe according an aspect of the disclosure.

FIG. 2 shows a second embodiment of the test setup 10, the measuring system 14 and the probe 18 being essentially the same as the first embodiment shown in FIG. 1. Thus, identical parts or parts with the same function are referenced to using the same numerals and only the differences between the embodiments are described in the following.

In the second embodiment, the first probe tip 28 and the second probe tip 29 are connected to the device under test using sockets 44.

The connection between the resistor 30 and the probe cable 32 is provided using a detachable connector 46.

Further, the test setup 10 of the second embodiment comprises a housing 48 that is separately formed from the probe 18. The housing 48 holds the resistor 30, wherein the housing 48 can be connected to the probe cable 32 and/or the housing 36 using the same or another detachable connector.

It is also possible that the connections between the housing 48 and the probe cable 32, between the resistor 30 and the probe cable 32, or between the housing 36 and the housing 48 are rigid solder joints.

In addition, the probe 18 of the second embodiment comprises an inductive component 52, for example a coil. The inductive component 52 is located between the output connector 34 and the probe cable 32, and in embodiment at the end of the probe cable 32 not being connected to the resistor 30. The inductive component 52 improves the measurement over a broad bandwidth.

In the shown embodiment of FIG. 2, the resistor 30 has an impedance or resistance $R_P$ corresponding to the impedance I of the probe cable 32, namely 50Ω.

In general, the resistor 30 has an impedance equal to the characteristic impedance of the probe cable 32 (embodiment according to FIG. 2) or an impedance equal to the difference between the characteristic impedance of the probe cable 32 and the output resistance Rs of the device under test 12 (embodiment according to FIG. 1).

Of course, the features of the two embodiments can be combined and interchanged. Especially the way of connecting the probe tips 28, 29 to the device under test 12 and the way of connecting the resistor 30 to the probe cable 32 may be either detachable connections using sockets, detachable connectors, rigid solder joints or other common connections.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A probe for measurements on a device under test with low source impedance, comprising:
    a probe tip for connecting said probe to said device under test;
    a probe cable coupled with said probe tip;
    an output connector for connecting said probe cable to a measuring apparatus; and,
    a resistor coupled in series between said probe tip and said probe cable,
    said probe being a passive probe, said probe cable having a characteristic impedance, said resistor having an impedance equal to said characteristic impedance of said probe cable.

2. The probe according to claim 1, wherein said characteristic impedance of said probe cable is selected from a group consisting of 50 Ohm, 75 Ohm, 100 Ohm and 150 Ohm.

3. The probe according to claim 1, wherein said resistor is located adjacent to said probe tip.

4. The probe according to claim 1, wherein said probe cable comprises an inner conductor, said resistor being connected to said inner conductor.

5. The probe according to claim 4, wherein said probe cable is a coaxial cable.

6. The probe according to claim 1, wherein said probe tip is adapted to be connected to said device under test via a socket or a rigid solder joint.

7. The probe according to claim 1, wherein said passive probe comprises a housing, said housing comprising said resistor, said housing being connected to said probe cable via a detachable connector or a rigid solder joint.

8. The probe according to claim 1, wherein said probe comprises an inductive component being located between said probe cable and said output connector.

9. A measuring system comprising a measuring apparatus with a high impedance input and a passive probe according to claim 1, said output connector of said passive probe being connected to said high impedance input.

10. The measuring system according to claim 9, wherein said measuring apparatus is an oscilloscope.

* * * * *